United States Patent [19]
Singh

[11] Patent Number: 6,069,515
[45] Date of Patent: May 30, 2000

[54] HIGH VOLTAGE INPUT BUFFER CIRCUIT USING LOW VOLTAGE TRANSISTORS

[75] Inventor: Gajendra P. Singh, Sunnyvale, Calif.

[73] Assignee: Sun Microsystems, Inc., Palo Alto, Calif.

[21] Appl. No.: 09/015,847

[22] Filed: Jan. 29, 1998

[51] Int. Cl.$^7$ .................................................. H03K 17/16
[52] U.S. Cl. ........................ 327/309; 327/312; 327/319; 327/333
[58] Field of Search .................................. 327/309, 333, 327/108, 312, 319

[56] References Cited

U.S. PATENT DOCUMENTS

| | | | |
|---|---|---|---|
| 3,369,129 | 2/1968 | Wolterman | 327/328 |
| 5,742,183 | 4/1998 | Kuroda | 326/81 |
| 5,789,942 | 8/1998 | Mizuno | 326/81 |

FOREIGN PATENT DOCUMENTS

| | | | |
|---|---|---|---|
| 354055360 | 5/1979 | Japan | 327/333 |
| 402134918 | 5/1990 | Japan | 327/333 |

OTHER PUBLICATIONS

Connor et al., "Dynamic Dielectric Protection for I/O Circuits Fabricated in a 2.5V CMOS Technology Interfacing a 3.3V LVTTL Bus," 1997 Symposium on VLSI Circuits Digest of Technical Papers, pp. 119–120.

*Primary Examiner*—Timothy P. Callahan
*Assistant Examiner*—Cassandra Cox
*Attorney, Agent, or Firm*—Townsend and Townsend and Crew LLP

[57] ABSTRACT

An input buffer circuit implemented with low voltage transistors, that is capable of receiving and recognizing input logic signals having higher voltage levels is disclosed. The present invention uses various circuit techniques to ensure that no transistor in the input buffer circuitry undergoes voltages higher than that allowed by the fabrication process, even though the input signal voltage may swing well beyond the tolerable voltage levels. This is accomplished without compromising the reliability of the input buffer circuit in detecting the logic levels of the input signal.

12 Claims, 4 Drawing Sheets

HIGH VOLTAGE INPUT BUFFER CIRCUIT USING LOW VOLTAGE TRANSISTORS

BACKGROUND OF THE INVENTION

The present invention relates in general to integrated circuits, and in particular to an input buffer circuit using low-voltage transistors, that is capable of receiving high-voltage logic levels.

To reduce power consumption there has been a growing trend in various fields of semiconductor technology (including memories, microprocessors, complex programmable logic devices, etc.) toward designing devices that have the core circuitry operating at lower power supply voltages. These circuits, however, still must be able to interface with other circuitry that run at higher voltage levels. For example, the core circuitry for a microprocessor may be designed to operate with a 3.3 volt or a 2.9 volt supply voltage, but the chip must be able to receive and process signals swinging between for example ground and +5 volts. The interface problem has been traditionally solved by level shifting circuitry that translate the voltage at the input/output (I/O) interface from one level to the other.

The voltage differential between the internal power supply levels and the external signal levels, however, has continued to grow as the power supply voltages for core circuitry drop to lower and lower levels. This has posed new challenges to the circuit designer. More specifically, the low voltage circuitry can be fabricated using a low voltage process that places limitations on maximum voltage levels under which a transistor can operate reliably. To prevent I/O transistors from experiencing high voltage stress, it is common to insert cascode transistors in series with the transistors that drive the I/O node. The cascode transistors are then typically biased by a reference voltage to split the total voltage between the several transistors.

This circuit technique works reliably up to a certain voltage differential. For example, with a fixed reference voltage of 1.65 volts biasing the cascode transistors of an output driver that runs off of a 3.3 volt supply, the I/O transistors in a 1.9 volt process still undergo voltage stress given overshoot or undershoot of about 0.8 volts.

Similarly, a typical input buffer is made up of an inverter with a PMOS pull-up transistor and an NMOS pull-down transistor that may be coupled between, for example, 1.9 volts and ground, in a 1.9 volt process. Given an input signal that swings between 0 and 3.3 volts, in the case of likely overshoot of, for example, 0.8 volts, the NMOS pull-down transistor experiences voltages much higher than 1.9 volts (i.e., 4.1 volts) and is therefore subject to oxide stress. In case of an undershoot of the input signal, the PMOS pull-up transistor would also undergo oxide stress. Traditional circuit techniques, therefore, fail to protect the low-voltage I/O transistors that interface with higher voltage signals.

There is a need for an input buffer circuit that can be implemented with low voltage transistors yet safely receives and detects the logic levels of a high voltage input signal.

SUMMARY OF THE INVENTION

The present invention provides an input buffer circuit implemented with low voltage transistors, that is capable of receiving and recognizing input logic signals having higher voltage levels. Broadly, the present invention uses various circuit techniques to ensure that no transistor in the input buffer circuitry undergoes voltages higher than that allowed by the fabrication process, even though the input signal voltage may swing well beyond the tolerable voltage levels. This is accomplished without compromising the reliability and speed of the input buffer circuit in detecting the logic levels of the input signal.

Accordingly, in one embodiment, the present invention provides an input buffer circuit that receives an input signal from an input node and includes a clip transistor having a first current-carrying terminal coupled to the input node, and a second current-carrying terminal coupled to a level detecting circuit. The input buffer circuit further includes a voltage swing limiting circuit that has an output coupled to a gate terminal of the clip transistor, and a feedback circuit that couples the input signal to the gate terminal of the clip transistor.

The level detecting circuit includes an inverting circuit having a pull-down transistor coupled to a first pull-up transistor as in an inverter, and a second pull-up transistor coupling the first pull-up transistor to an internal power supply node. The level detecting circuit further includes undershoot protection circuitry coupling the second current-carrying terminal of the clamp transistor to a common node between the first and second pull-up transistor such that the voltage at the common node is reduced when the voltage at the second current-carrying terminal goes below a predetermined level.

A better understanding of the nature and advantage of the input buffer circuit of the present invention may be had with reference to the detailed description and drawings below.

DESCRIPTION OF THE PREFERRED EMBODIMENT

Typical core supply voltages for low power circuits designed up to now may range from 2.5 volts to 2.9 volts. To interface with 3 volt or 5 volt signals, there is still enough margins for conventional I/O circuitry to reliably detect the input logic level without subjecting the I/O transistors to high voltage stress. When the core supply voltage level is reduced to as low as, for example, 1.9 volts and the I/O circuitry uses 1.9 volt transistors, interfacing with signals that swing up to for example 3.3 volts subjects the gate oxide of the I/O transistors to unacceptable levels of voltage stress.

The present invention uses 1.9s volt and 3.3 volts for the lower core supply voltage and the higher external signal levels, respectively, as exemplary values to illustrate the principles of operation of the input buffer circuit of the present invention. It is to be understood that these voltage levels are exemplary only and that the solution offered by the circuit of the present invention may be applied when using other voltage conditions that give rise to similar problems.

Figure 1:
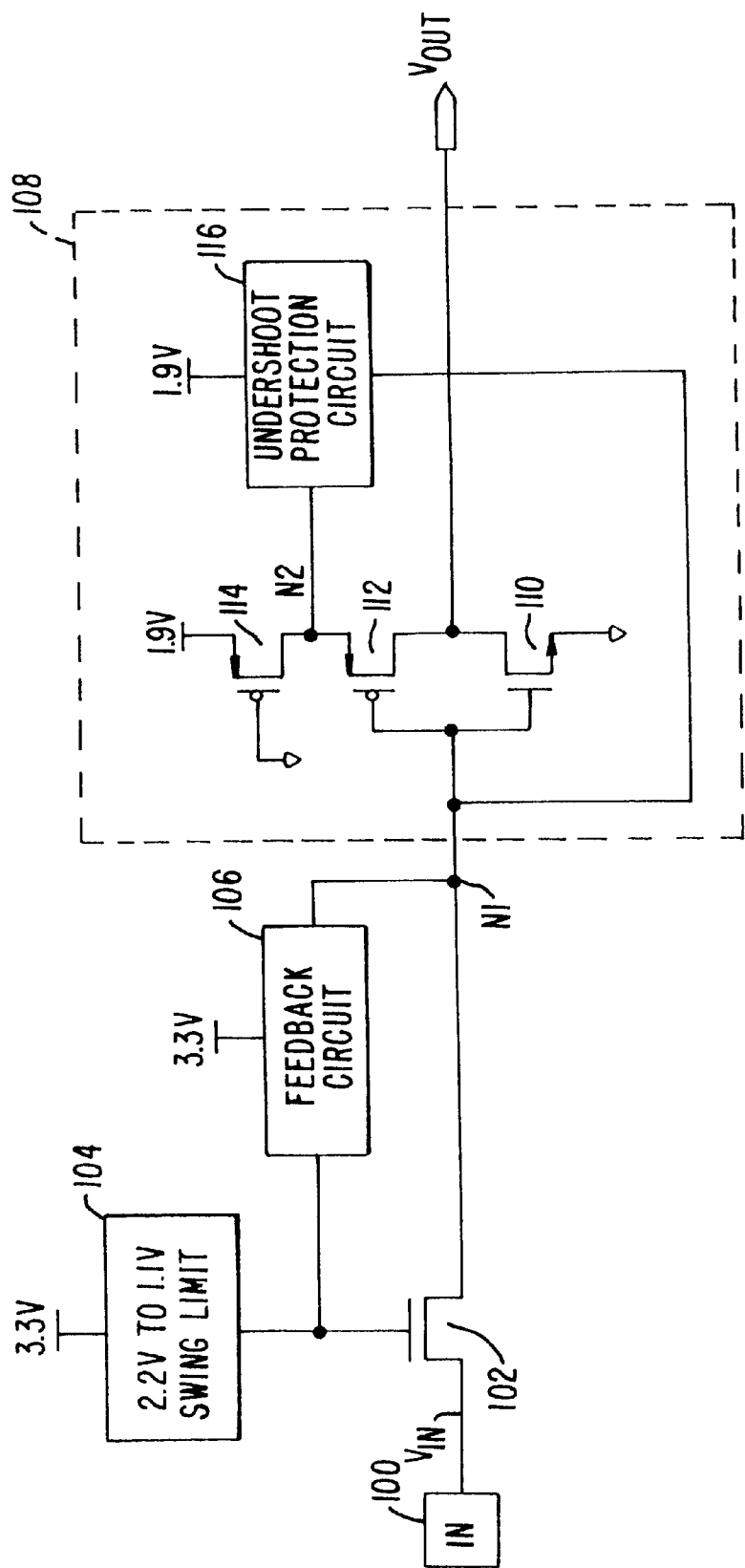
FIG. 1 is a simplified block diagram of an exemplary implementation of an input buffer according to the present invention.

Referring to FIG. 1, there is shown a simplified block diagram of an exemplary implementation of the input buffer circuit according to the present invention. An input pin 100 receives an input signal Vin that may swing between 0 (ground) and 3.3 volts with possible overshoot and undershoot of, for example, ±0.8 to ±1.1 volts. Transistors inside the input buffer circuit must therefore be able to safely accept voltages as high as 4.1 volts and as low as −0.8 volts.

The input buffer circuit includes an NMOS transistor 102 that has a first source/drain terminal connected to input pin 100 and a second source/drain terminal connected to node N1. A feedback circuit 106 feeds back the signal at node N1 to the gate terminal of NMOS transistor 102. The output of a voltage swing limiting circuit 104 also connects to and drives the gate terminal of NMOS transistor 102.

Voltage swing limiting circuit 104 includes a voltage divider circuit that divides a 3.3 volt supply to generate a first reference signal of, for example, 1.1 volts and a second reference signal of, for example, 2.2 volts. Voltage swing limiting circuit 104 further includes circuitry that allows its output to vary between the two reference signals, but not go beyond either one. Thus, while the signal at the gate terminal of NMOS transistor 102 follows the input signal through feedback circuit 106, its voltage swing is limited between 1.1 and 2.2 volts by voltage swing limiting circuit 104. A preferred embodiment for voltage swing limiting circuit 104 is described in detail in commonly-assigned, co-pending U.S. patent application Ser. No. 09/014890 (Atty Docket No. 016747-83/P2566), entitled "Bias Generator Circuit for Low Voltage Applications," which is hereby incorporated by reference for all purposes in its entirety.

Figure 4:
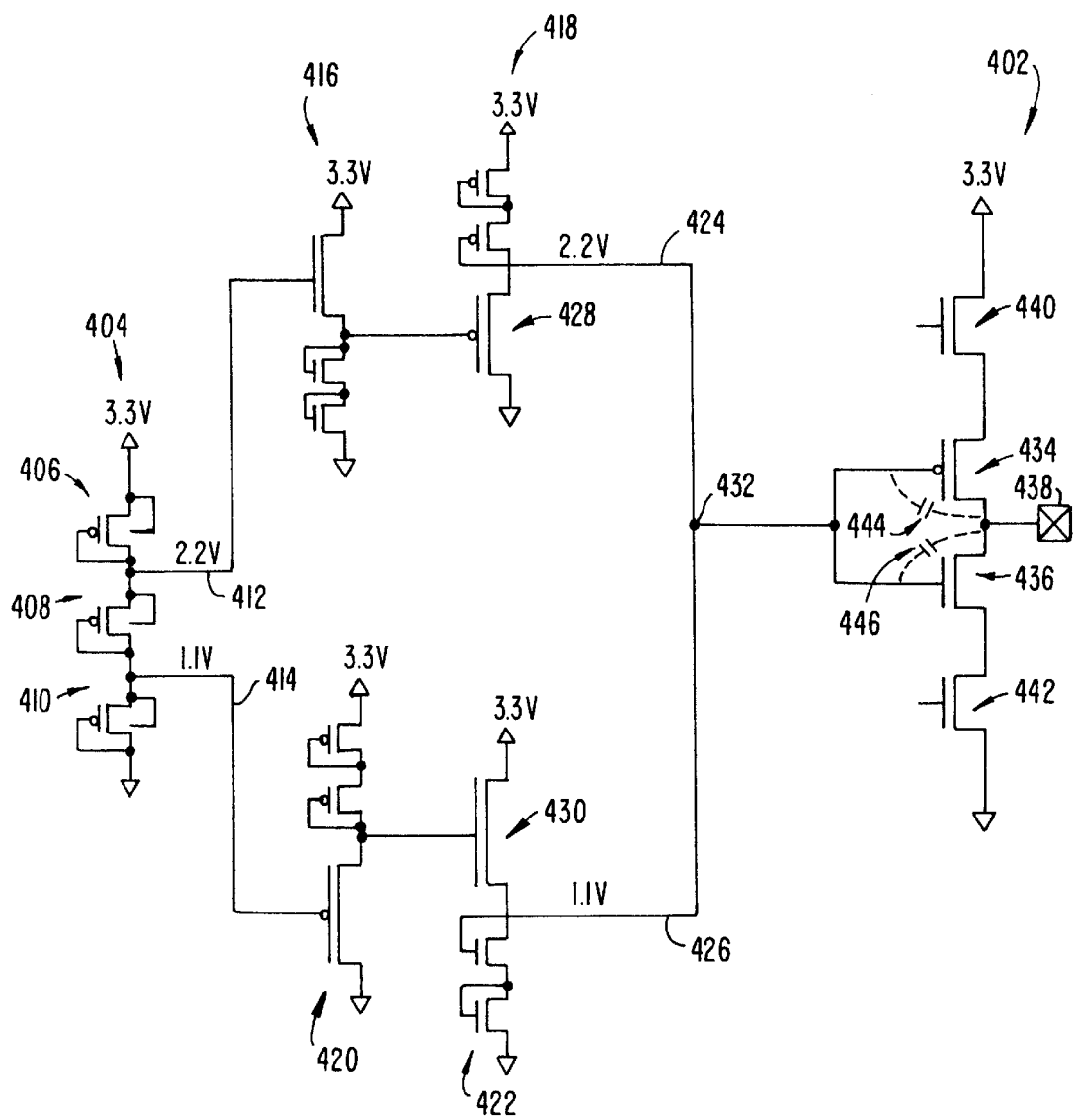
FIG. 4 shows an exemplary embodiment of a voltage swing limiting circuit.

For completeness, relevant portions of co-pending U.S. patent application Ser. No. 09/014,890 (Atty. Docket No. 016747-83/P2566) are reproduced below:

"FIG. 4 shows an exemplary embodiment of a voltage swing limiting circuit. In this case, instead of having the output node at a fixed level such as 1.9 volts, the output node is limited from swinging beyond a range. In the example shown, the output node is not allowed to go above 2.2 volts, or below 1.1 volts, but is allowed to vary in-between. In the example shown, this is used for driving an output buffer circuit 402 wherein the transistors need to be protected from having more than 1.9 volts across them, while the output must interface to a 3.3 volt circuit. One example of the application of this circuit is set forth in co-pending and commonly-assigned application No. 09/015378, entitled "Dynamic Bias Circuit for Driving Low Voltage I/O Transistors," (Atty. Docket No. 16747-63/P2319).

An initial transistor divider circuit 404 using transistors 406, 408 and 410 is used to provide 2.2 volts at a node 412. A second node 414 is used to provide a 1.1 volt bias circuit. The 2.2 volts is first shifted down with a voltage level shifting transistor circuit 416, and then shifted up with a voltage level shifting circuit 418. Similarly, the 1.1 volt node 414 is first shifted up with a voltage level shifting circuit 420, and then shifted down with a voltage level shifting circuit 422. This provides an output 424 with a maximum value of 2.2 volts, and an output 426 with a minimum voltage of 1.1 volts.

Thus, if node 424 attempts to go higher than 2.2 volts, pMOS transistor 428 will turn on, pulling it back to 2.2 volts. Similarly, if output 426 attempts to go lower than 1.1 volts, nMOS transistor 430 will turn on, pulling output 426 back up to 1.1 volts. By tying outputs 424 and 426 together at a node 432, a bias voltage output is provided which can float or vary only between 1.1 and 2.2 volts. In the embodiment shown, this is connected to two output transistors 434 and 436 to allow the driving of an output pad 438 which connects to external circuitry which operates at a 3.3 volt level. The output driver includes transistors 434 and 436, as well as control transistors 440 and 442 which are responsive to the logic signal driving the output. Node 432 provides a voltage swing limiting function which avoids having more than 1.9 volts applied across any of the output transistors in circuit 402, while at the same time allowing those transistors to vary their levels to drive overshoots and undershoots upon switching voltage levels, as described in more detail in the above-referenced application Ser. No. 09/015378 [16747-63]. As illustrated, node 432 may be drawn up or down within the levels shown by parasitic capacitances 444 and 446."

By thus limiting the maximum voltage at the gate terminal of transistor 102 to 2.2 volts, the voltage at node N1 will not exceed 2.2-Vtn, where Vtn is the threshold voltage of NMOS transistor 102. This is so, because as Vin swings up toward 3.3 volts, NMOS transistor 102 turns off and ceases to conduct when Vin reaches about 2.2-Vtn. Accordingly, give an exemplary Vtn of about 0.3 volts, the voltage at node N1 will not exceed 1.9 volts. One of skill in this art appreciates that the threshold voltage Vtn may vary between, for example, 0.3 to 0.5 volts depending on the fabrication process. This, however, leaves more than enough margin to properly detect the logic level of the signal. On the negative swing of Vin, the voltage at node N1 follows Vin all the way down to ground. Therefore, The signal at node N1 replicates Vin except that it is clipped at 2.2-Vtn= 1.9volts.

The input buffer circuit of the present invention further includes a level detecting circuit 108 whose input connects to node N1. Level detecting circuit 108 includes a CMOS inverter-type circuit made up of NMOS transistor 110 and PMOS transistor 112, that is connected to the internal positive power supply of 1.9 volts via a level shift PMOS transistor 114. The gate terminal of level shift PMOS transistor 114 connects to ground making sure that PMOS 114 is turned on and conducting at all times. The gate terminals of PMOS 112 and NMOS 110 connect to node N1.

Level detecting circuit 108 further includes an undershoot detection and protection circuit 116 that connects between node N1 and the common node N2 between PMOS 112 and PMOS 114. The function of undershoot detection and protection circuit 116 is to reduce the voltage level at node N2 when the signal at node N1 undershoots below ground.

Thus, when Vin swings up to 3.3 volts, node N1 goes up to about 2.2-Vtn (e.g., 1.9) volts, safely turning on NMOS transistor 110 and turning off PMOS transistor 112. This pulls the output node Vout down to ground signaling a logic low level while at the same time ensuring that none of the transistors experience a voltage greater than 1.9 volts. When Vin swings down toward ground, node N1 follows turning off NMOS transistor 110 and turning on PMOS transistor 112. This pulls node Vout up toward the internal power supply voltage 1.9 volts, detecting a logic high level.

In the negative direction, however, node N1 may fall to −0.8 volts in case of an undershoot. With −0.8 volts at its gate, NMOS transistor 110 is turned off. PMOS transistor 112 is turned on, but requires the operation of undershoot detection and protection circuit 116 to reduce the voltage at its source terminal to ensure that it is not subject to a voltage greater than 1.9 volts. The details of operation of undershoot protection circuit 116 as well as feedback circuit 106 will be described hereinafter in connection with the exemplary circuit embodiment shown in FIG. 2.

Figure 2:
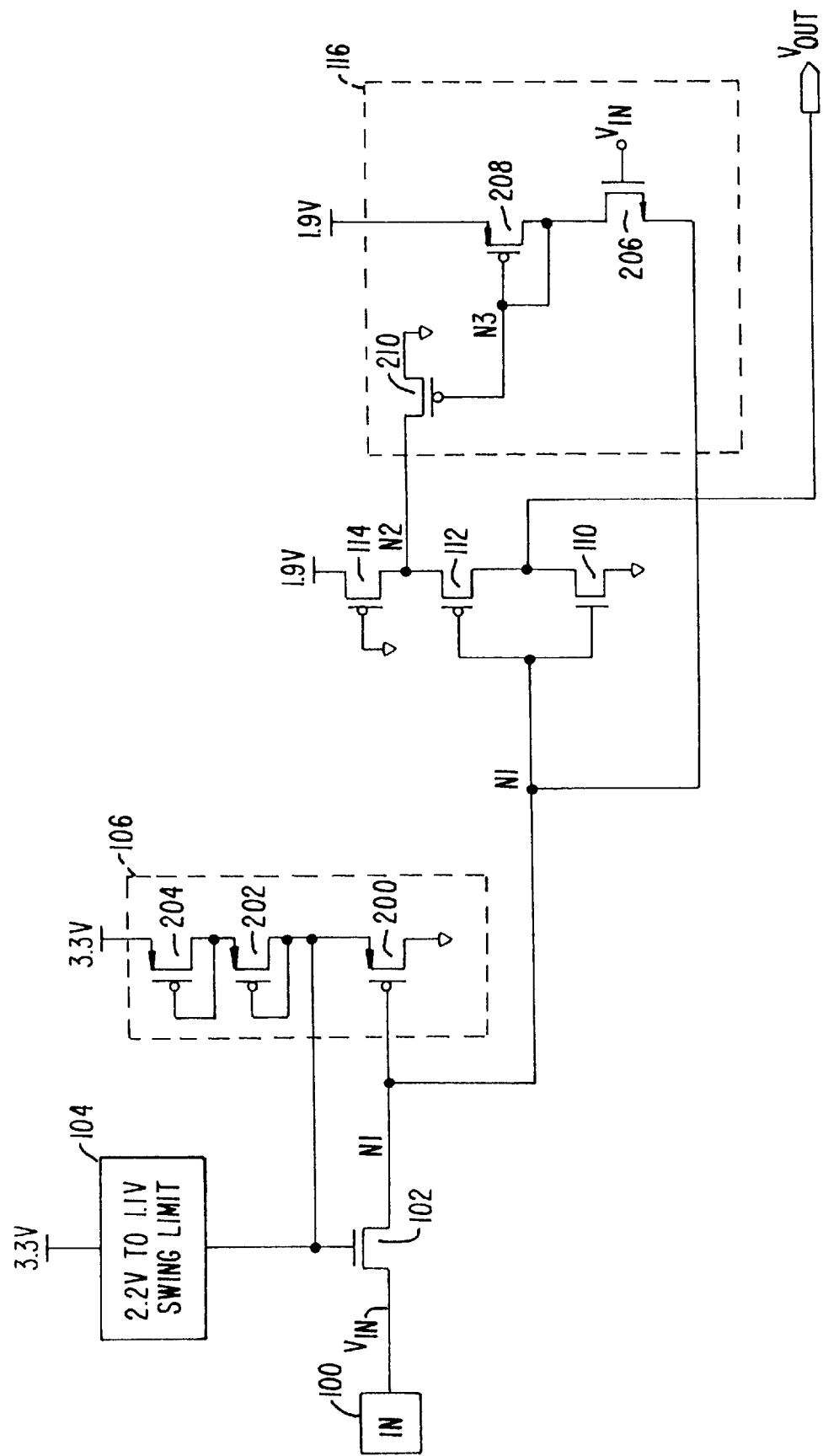
FIG. 2 is an exemplary transistor-level circuit schematic of the input buffer according to the present invention.

Referring to FIG. 2, there is shown an exemplary transistor-level implementation of the input buffer circuit of the present invention in greater detail. The same reference numerals are used in all Figures to refer to the identical circuit elements. As shown in FIG. 2, feedback circuit 106 includes a PMOS transistor 200 that receives node N1 at its gate terminal. The drain terminal of PMOS transistor 200 connects to ground, while its source terminal connects to the gate terminal of clip NMOS transistor 102. Two small and therefore weak gate-drain-connected PMOS transistors 202 and 204 connect the source terminal of PMOS transistor 200 to the higher supply voltage of 3.3 volts. The function of PMOS transistors 202 and 204 is to provide a current-limiting resistive load device for PMOS transistor 200. It is understood by a person skilled in this art that there exists alternative implementations such as using NMOS transistors to provide a current-limiting resistive load.

As the signal at node N1 follows the input signal Vin, PMOS transistor 200 operates in a source-follower mode to couple the signal at its gate terminal to the gate terminal of clip transistor 102. PMOS transistors 202 and 204 act as current-limiting load devices that draw very little quiescent current due to their small size. In this fashion, feedback circuit 106 essentially guides the gate terminal of clip NMOS transistor 102 to follow the input signal Vin. A preferred embodiment of the present invention would include feedback circuit 106 when the circuit is an input buffer only. As discussed in the above-referenced related patent application, when connected to an input/output node that also includes an output buffer circuit, this feedback action would work in addition to large parasitic capacitances of the output buffer circuitry (cascode transistors) that also couple the signal at the I/O pad to the output of swing limiting circuit 104. Therefore, while the preferred embodiment of the present invention includes feedback circuit 106, the parasitic capacitances of the output buffer transistors may provide sufficient coupling of the input signal when there is an output buffer driving the same node.

Referring now to undershoot protection circuit 116 shown in FIG. 2, the circuit includes an NMOS transistor 206 that receives the signal at node N1 at its source terminal. The gate terminal of NMOS transistor 206 is connected to a reference voltage generator that generates a voltage equal to one Vtn. This reference voltage of Vtn can be generated using a voltage divider such as a couple of gate-drain-connected NMOS transistors coupled between the internal power supply voltage 1.9 volts and ground. One Vtn can then be readily generated by proper weighting of the transistor sizes in the resulting voltage divider.

A gate-drain-connected PMOS (or alternatively NMOS) transistor 208 connects the drain terminal of NMOS transistor 206 to the internal power supply, 1.9 volts. The drain terminal of NMOS transistor 206 also connects to the gate terminal of a PMOS transistor 210 whose source/drain terminals connect between node N2 and ground.

In operation, with one Vtn at its gate terminal, NMOS transistor 206 turns on every time the signal at node N1 undershoots below ground. With NMOS transistor 206 conducting, the voltage at node N3 (drain terminal of NMOS 206) drops low enough to turn on PMOS transistor 210, steeling current from node N2. With PMOS transistor 210 turned on, there is essentially a voltage dividing action performed by PMOS transistors 114 and 210. The exact amount of reduction in the voltage level at node N2 can be controlled by proper rationing of the sizes of the two PMOS transistors. This protects PMOS transistor 112 from ever experiencing a voltage higher than 1.9 volts.

In case of an overshoot of the input signal Vin, there still exists the danger of PMOS transistor 200 receiving a voltage higher than 2.2−Vtn=1.9 volts at its gate. This may happen, for example, by capacitive coupling of the input signal through very large parasitic capacitances of output transistors that may connect to the same node 100 if it were an I/O pad. A quick remedy for this situation would be to insert a diode-connected PMOS transistor (not shown) between the drain terminal of PMOS transistor 200 and ground to split the voltage. A better solution, however, is to clamp the voltage at node N1 to 1.9 volts by a circuit such as the one described in the related and commonly-assigned U.S. patent application Ser. No. 09/027,401 (Atty. Docket No. 015114-0093/P2441), entitled "Low Voltage CMOS Input Buffer with Overshoot/Undershoot Protection."

Figure 3:
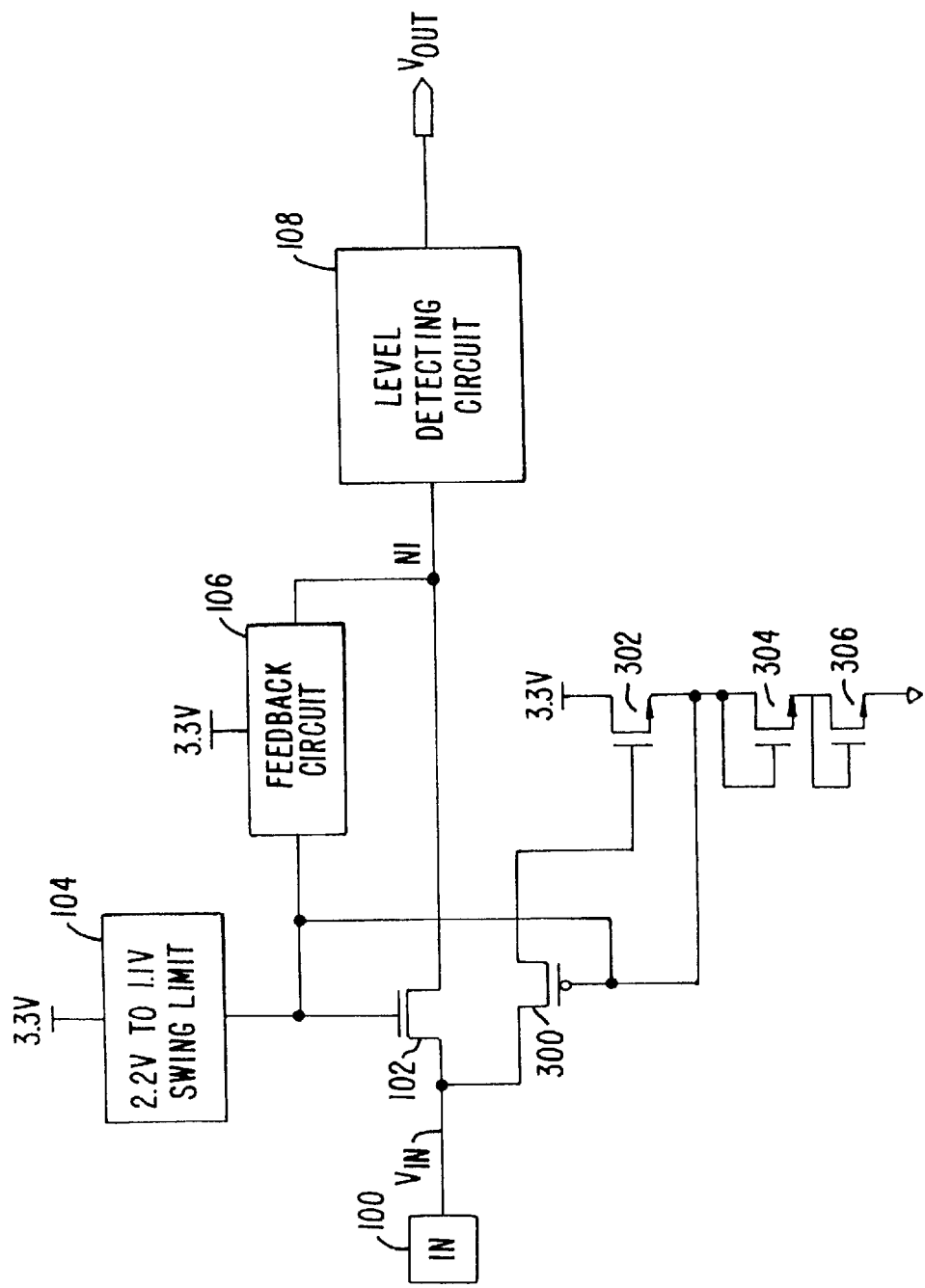
FIG. 3 shows an another embodiment of the input buffer circuit of the present invention.

Because of the polarity of the transistors used in feedback circuit 106 as well as clip transistor 102, this circuit works faster in guiding the voltage at the gate terminal of clip NMOS transistor 102 to move from 2.2 volts down to 1.1 volts, than it does in the opposite direction. Referring to FIG. 3, there is shown an improvement to the input buffer circuit of the present invention that speeds up the feedback action in the positive going direction. This additional circuitry includes a PMOS clip transistor 300 connected to a string of NMOS transistors 302, 304, and 306 in a similar fashion to feedback circuit 106 (FIG. 2). Diode-connected NMOS transistor 304 and 306 are small and therefore weak transistors that bias the stronger NMOS pull-up transistor 302. The stronger NMOS pull-up transistor 302 provides the extra drive needed to pull the voltage at the gate terminal of clip NMOS transistor 102 up to 2.2 volts.

In conclusion, the present invention provides an input buffer circuit for low voltage operation, that uses various circuit techniques to enable it to safely receive and reliably detect input logic signals having larger voltage swings. While the above describes exemplary embodiments of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A CMOS input buffer circuit having an input terminal and an output terminal, comprising:
    a clip transistor having a first current-carrying terminal coupled to the input terminal of the input buffer circuit;
    a voltage limiting circuit having an output terminal coupled to a gate terminal of said clip transistor; and
    a level detecting circuit having an input terminal coupled to a second current-carrying terminal of said clip transistor, and an output terminal coupled to the output terminal of the input buffer circuit, wherein said level detecting circuit comprises a CMOS inverter having a first NMOS pull-down transistor coupled to ground, and a first PMOS transistor coupled to a second power supply voltage via a second PMOS transistor.

2. The input buffer circuit of claim 1 wherein said voltage limiting circuit couples between a first power supply voltage and ground, and said level detecting circuit couples between a second power supply voltage and ground, and wherein, said first power supply voltage is greater than said second power supply voltage.

3. The input buffer circuit of claim 2 further comprising a feedback circuit coupled between said second current-carrying terminal of said clip transistor and said gate terminal of said clip transistor, said feedback circuit being coupled between said first power supply voltage and ground.

4. The input buffer circuit of claim 3 wherein said clip transistor is of an NMOS type.

5. The input buffer circuit of claim 4 wherein said level detecting circuit further comprises an undershoot protection circuit coupled between said second current-carrying terminal of said clip transistor and a common node between said first PMOS transistor and said second PMOS transistor, said undershoot protection circuit being coupled to said second power supply voltage.

6. The input buffer circuit of claim 5 wherein said undershoot protection circuit comprises:

a switch NMOS transistor having a first current-carrying terminal coupled to said second current-carrying terminal of said clip transistor; and a PMOS transistor coupled between said switch NMOS transistor and said common node, wherein, said switch NMOS transistor turns on when a signal level at said second current-carrying terminal of said clip transistor falls below ground, causing said PMOS transistor to draw current and reduce a voltage level at said common node.

7. The input buffer circuit of claim 4 wherein said feedback circuit comprises:

a PMOS pull-down transistor having a gate terminal coupled to said second current-carrying terminal of said clip transistor, a drain terminal coupled to ground and a source terminal coupled to said gate terminal of said clip transistor; and a load circuit coupling said source terminal of said PMOS pull-down transistor to said first power supply voltage.

8. The input buffer circuit of claim 7 wherein said load circuit comprises two serially-connected PMOS transistors.

9. The input buffer circuit of claim 8 further comprising:

a PMOS clip transistor having a first current-carrying terminal coupled to the input terminal of the input buffer circuit and a gate terminal coupled to said gate terminal of said clip transistor of NMOS type;

an NMOS pull-up transistor having a gate terminal coupled to a second current-carrying terminal of said PMOS clip transistor, a source terminal coupled to a gate terminal of said PMOS clip transistor, and a drain terminal coupled to said first power supply voltage; and a second load circuit coupling said source terminal of said NMOS pull-up transistor to ground.

10. The input buffer circuit of claim 9 wherein said second load circuit comprises two serially-connected NMOS transistors.

11. The input buffer circuit of claim 2 wherein said first power supply voltage is approximately 3.3 volts and said second power supply voltage is approximately 1.9 volts.

12. The input buffer circuit of claim 11 wherein said voltage limiting circuit limits a voltage swing of the signal at its output between about 1.1 volts and 2.2 volts.

* * * * *